United States Patent
Froeschl

(10) Patent No.: US 7,821,226 B2
(45) Date of Patent: Oct. 26, 2010

(54) METHOD FOR THE ALLOCATION OF ADDRESSES IN THE MEMORY CELLS OF A RECHARGEABLE ENERGY ACCUMULATOR

(75) Inventor: Joachim Froeschl, Herrsching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 12/371,318

(22) Filed: Feb. 13, 2009

(65) Prior Publication Data
US 2009/0207680 A1 Aug. 20, 2009

Related U.S. Application Data

(63) Continuation of application No. PCT/EP2007/006838, filed on Aug. 2, 2007.

(30) Foreign Application Priority Data
Aug. 17, 2006 (DE) .................... 10 2006 038 678

(51) Int. Cl.
*H02J 7/14* (2006.01)
*G11C 29/30* (2006.01)
*G11C 15/04* (2006.01)
*G01R 31/28* (2006.01)

(52) U.S. Cl. .............. 320/104; 714/718; 714/730; 365/49.12; 365/230.01

(58) Field of Classification Search ............ 320/103, 320/104; 365/230.01, 49.12; 714/718, 721, 714/730
See application file for complete search history.

(56) References Cited

U.S. PATENT DOCUMENTS

| 5,859,804 | A | * | 1/1999 | Hedberg et al. ............. 365/201 |
| 6,094,053 | A | | 7/2000 | Harvey |
| 6,919,707 | B2 | * | 7/2005 | Kawai et al. ................ 320/117 |
| 6,978,405 | B1 | * | 12/2005 | Sellmair ..................... 714/718 |
| 2006/0209583 | A1 | * | 9/2006 | Kawabata et al. ............. 365/49 |

FOREIGN PATENT DOCUMENTS

| DE | 44 22 005 A1 | 12/1995 |
| DE | 195 45 833 A1 | 6/1997 |
| DE | 198 22 571 A1 | 11/1999 |
| EP | 0 851 556 A2 | 7/1998 |
| EP | 1 328 052 A2 | 7/2003 |
| WO | WO 98/10478 A1 | 3/1998 |

OTHER PUBLICATIONS

International Search Report dated Nov. 6, 2008 with English translation (six (6) pages).
German Search Report dated Mar. 8, 2007 with English translation (nine (9) pages).

* cited by examiner

*Primary Examiner*—Edward Tso
*Assistant Examiner*—M'Baye Diao
(74) *Attorney, Agent, or Firm*—Crowell & Moring LLP

(57) ABSTRACT

A method for placing addresses in the memory cells of a rechargeable energy storage device for use in a motor vehicle, each of which memory cells includes at least one sensor device and an individualizing device for storing an address. In order to optimize the placing of addresses in the memory cells of a rechargeable storage device, the functionality of the memory cells is checked using the sensor device in the vehicle, an individual address is assigned to each operable memory cell, and the individual address is used to individualize the sensor values made available from the sensor device.

10 Claims, 1 Drawing Sheet

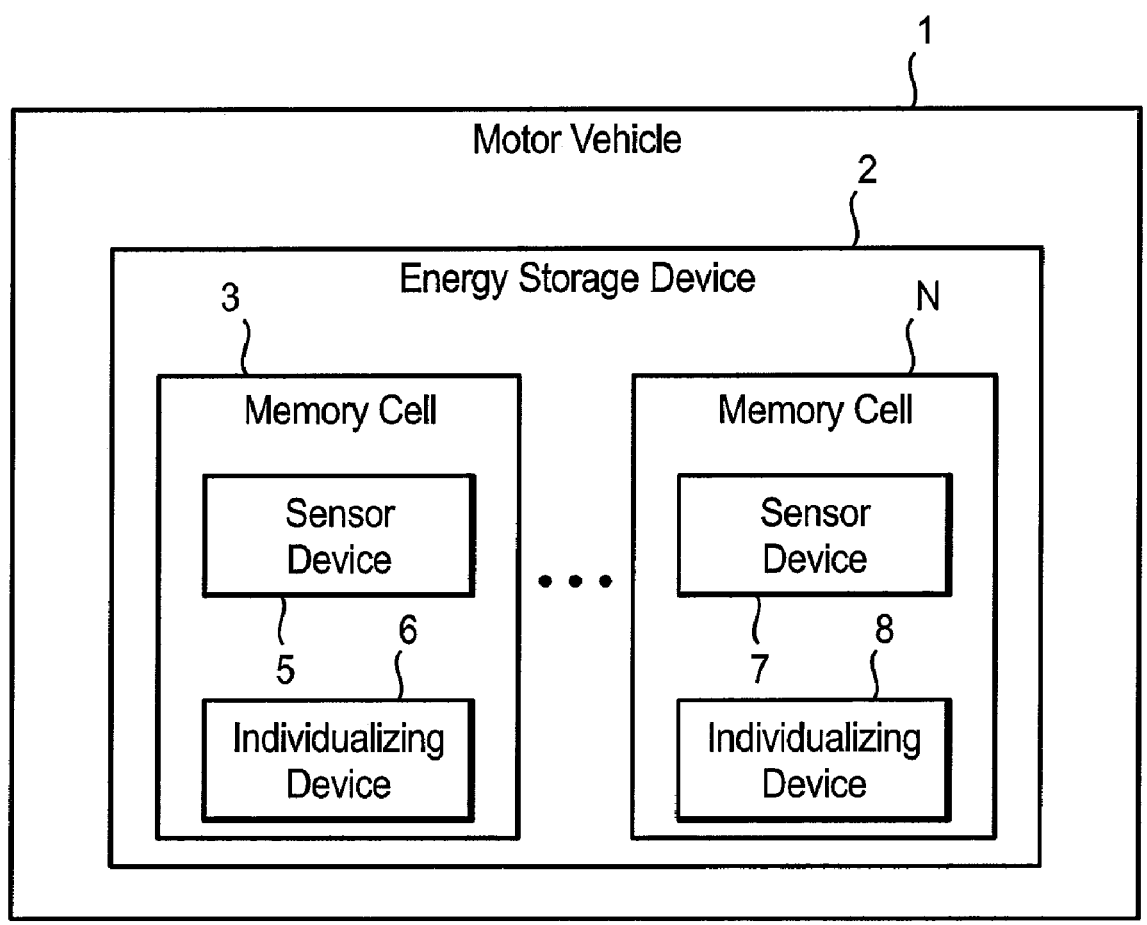

METHOD FOR THE ALLOCATION OF ADDRESSES IN THE MEMORY CELLS OF A RECHARGEABLE ENERGY ACCUMULATOR

CROSS REFERENCE TO RELATED APPLICATIONS

This application is a continuation of PCT International Application No. PCT/EP2007/006838, filed Aug. 2, 2007, which claims priority under 35 U.S.C. § 119 to German Patent Application No. 102006038678.7, filed Aug. 17, 2006, the entire disclosures of which are herein expressly incorporated by reference.

BACKGROUND AND SUMMARY OF THE INVENTION

The invention relates to the placing of addresses in the memory cells of a rechargeable energy storage device for use in a motor vehicle, each of which memory cells includes at least one sensor device and an individualizing device for storing an address.

In known memory cells of a rechargeable energy storage device that include an individualizing device and a sensor device, an address is inputted into the individualizing device in order to be able to assign the sensor values emitted by the sensor device to an address or a concrete memory cell. The inputting of the address into the individualizing device in order to be able to communicate with the sensor device via the data bus of a motor vehicle takes place in the known process after the completion of the rechargeable energy storage device, checking it for its working order and before it is built into the vehicle.

This process has the disadvantage that the presence of an address in the individualizing device only admits the conclusion that the memory cells were operable at the time of the inputting of the address. After the inclusion and during the operation in the motor vehicle the presence of the address in the individualizing device supplies no statement about whether the particular memory cell is still in working order. The inputting of the addresses entails expenses and it can hardly be ensured that one and the same address is not placed twice.

The invention solves the problem of optimizing the placing of addresses in the memory cells of a rechargeable storage device.

Other objects, advantages and novel features of the present invention will become apparent from the following detailed description of one or more preferred embodiments when considered in conjunction with the accompanying drawings.

BRIEF DESCRIPTION OF THE DRAWINGS

The FIGURE provides a schematic illustration of an exemplary embodiment of an energy storage device of a motor vehicle, in accordance with the invention.

DETAILED DESCRIPTION OF THE DRAWINGS

A motor vehicle 1, as illustrated schematically in the FIGURE, includes an energy storage device 2, which includes a plurality of memory cells 3 . . . N. Each memory cell includes a sensor device and an individualizing device, e.g., memory cell 3 has a sensor device 5 and an individualizing device 6, and memory cell N has a sensor device 7 and an individualizing device 8.

A significant aspect of the invention consists in further developing the known process such that the functionality of the memory cells is checked using the sensor device in the vehicle, that an individual address is assigned to each operable memory cell, and that the individual address is used to individualize the sensor values made available from the sensor device.

This makes it possible that an address is assigned only to those memory cells that are also actually operable in the inserted state in the vehicle. Thus, the placing of an address is a criterion that a particular memory cell is functional or operational at the time of the check in the vehicle and that its sensor values can be detected and monitored. Furthermore, it can be ensured that one and the same address was not placed in two or more memory cells or other vehicle components.

A preferred embodiment of the invention provides that the functionality of the memory cells is regularly checked during the operation of the motor vehicle and that an address is assigned anew only to such memory cells that are functional. This ensures to a large extent that it can be concluded from the placing of the address or from the presence of the address that the memory cell is currently operable. Memory cells that are excessively old, or memory cells that are no longer operative for other reasons are recognized and appropriate countermeasures can be taken.

An embodiment of the invention provides that the first memory cell is considered to be functional when its voltage is between a first lower voltage value and a first upper voltage value. This ensures that the memory cell is endangered neither by a voltage that is too high nor exposed to a change of polarity by a voltage that is too low.

A further embodiment of the invention provides that the second memory cell is considered to be functional when its voltage is between a second lower voltage value and a second upper voltage value. According to a further development the second lower voltage value is higher than the first upper voltage value. This can ensure a sufficient distance between the voltages of the individual memory cells.

A preferred embodiment of the invention provides that another address, in particular a higher address, is assigned to the second memory cell than to the first memory cell. This individualizes the memory cells. The second memory cell, that has a higher voltage than the first memory cell, etc, is preferably associated with a higher address for the following reason. Using the position of the actuation device in the address spectrum, a conclusion can then be directly made about the position of the memory cell in the voltage series formed by all memory cells of the rechargeable energy storage device.

An embodiment of the invention provides that if the check showed that the memory cell in question is not functional, at least one new check is performed. This can distinctly lower the number of defective estimations.

A further development of the invention provides that if a predetermined number of checks had the result that the memory cell in question is not functional, a measure for changing this situation is performed. This measure can consist in a changing of the voltage by charging or discharging the memory cell, a balancing of the memory cells, that is, a changing of the voltage of the memory cells relative to each other, a determination of the inner resistance of the memory cell, a determination of the capacity of the memory cell or of the memory cells, and/or in a functional check of the sensor device.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for placing addresses in memory cells of a rechargeable energy storage device for use in a motor vehicle, each of which memory cells includes at least one sensor device and an individualizing device for storing an address, wherein functionality of the memory cells is checked using the at least one sensor device in the vehicle, an individual address is assigned to each operable memory cell, and the individual address is used to individualize sensor values made available from the at least one sensor device, wherein a first memory cell is considered to be functional when its voltage is between a first lower voltage value and a first upper voltage value, and wherein a second memory cell is considered to be functional when its voltage is between a second lower voltage value and a second upper voltage value.

2. The method according to claim 1, wherein the functionality of the memory cells is regularly checked during the operation of the motor vehicle and an address is assigned anew only to such memory cells that are functional.

3. The method according to claim 1, wherein the second lower voltage value is higher than the first upper voltage value.

4. The method according to claim 1, wherein another address, in particular a higher address, is assigned to the second memory cell than to the first memory cell.

5. A method for placing addresses in memory cells of a rechargeable energy storage device for use in a motor vehicle, each of which memory cells includes at least one sensor device and an individualizing device for storing an address, wherein functionality of the memory cells is checked using the at least one sensor device in the vehicle, an individual address is assigned to each operable memory cell, and the individual address is used to individualize sensor values made available from the at least one sensor device, wherein, when the check indicates that a first memory cell is not functional, at least one new check is performed, and wherein if a predetermined number of checks indicate that the first memory cell is not functional, at least one of changing the voltage by charging or discharging the first memory cell, balancing the memory cells by changing the voltage of the memory cells relative to each other, determining the inner resistance of the memory cell, determining the capacity of the first memory cell or the memory cells, and checking functionality of the sensor device is performed.

6. A method for placing addresses in memory cells of a rechargeable energy storage device for use in a motor vehicle, each of which memory cells includes a sensor device and an individualizing device for storing an address, the method comprising the acts of:

checking operability of the memory cells with the sensor device;

assigning an individual address to each operable memory cell; and individualizing sensor values made available from the sensor device based on the individual address assigned to each operable memory cell, wherein a first memory cell is considered to be functional when its voltage is between a first lower voltage value and a first upper voltage value, and wherein a second memory cell is considered to be functional when its voltage is between a second lower voltage value and a second upper voltage value.

7. The method according to claim 6, wherein the functionality of the memory cells is regularly checked during the operation of the motor vehicle and an address is assigned anew only to such memory cells that are functional.

8. The method according to claim 6, wherein the second lower voltage value is higher than the first upper voltage value.

9. The method according to claim 6, wherein another address, in particular a higher address, is assigned to the second memory cell than to the first memory cell.

10. A method for placing addresses in memory cells of a rechargeable energy storage device for use in a motor vehicle, each of which memory cells includes a sensor device and an individualizing device for storing an address, the method comprising the acts of:

checking operability of the memory cells with the sensor device;

assigning an individual address to each operable memory cell; and individualizing sensor values made available from the sensor device based on the individual address assigned to each operable memory cell, wherein when the check indicates that a first memory cell is not functional, at least one new check is performed, and wherein if a predetermined number of checks indicate that the first memory cell is not functional, at least one of changing the voltage by charging or discharging the first memory cell, balancing the memory cells by changing the voltage of the memory cells relative to each other, determining the inner resistance of the memory cell, determining the capacity of the first memory cell or the memory cells, and checking functionality of the sensor device is performed.

* * * * *